United States Patent [19]

Yim

[11] Patent Number: 4,553,041
[45] Date of Patent: Nov. 12, 1985

[54] MONOLITHIC ZERO CROSSING TRIAC DRIVER

[75] Inventor: Hyung J. Yim, Tempe, Ariz.

[73] Assignee: Motorola, Inc., Schaumburg, Ill.

[21] Appl. No.: 525,196

[22] Filed: Aug. 22, 1983

[51] Int. Cl.[4] .......................................... H03K 17/72
[52] U.S. Cl. ........................... 307/252 A; 307/252 B; 307/252 T; 307/252 UA; 307/311
[58] Field of Search ........ 307/252 B, 252 T, 252 UA, 307/305, 311

[56] References Cited

U.S. PATENT DOCUMENTS

| | | | |
|---|---|---|---|
| 3,777,188 | 12/1973 | Mazur | 307/252 UA |
| 4,015,143 | 3/1977 | Tokunaga et al. | 307/252 J |
| 4,063,115 | 12/1977 | Okuhara et al. | 307/252 G |
| 4,084,110 | 4/1978 | Okuhara et al. | 307/252 G |
| 4,224,634 | 9/1980 | Svedberg | 357/38 |
| 4,295,058 | 10/1981 | Lade et al. | 307/252 UA |
| 4,322,637 | 3/1982 | Takasago | 307/252 UA |
| 4,396,932 | 8/1983 | Alonas et al. | 307/252 UA |

*Primary Examiner*—John Zazworsky
*Attorney, Agent, or Firm*—William E. Koch

[57] ABSTRACT

A monolithic, light-activated zero-crossing triac driver is provided that includes back-to-back thyristors, whose gates are shunted by both a resistor to reduce the overall sensitivity and a first field effect transistor. A second field effect transistor shunts the gate of the first field effect transistor. A photovoltaic diode is coupled between the base of the thyristor and the gates of the first and second field effect transistors and serves as a current source to charge the gate capacitance of the first field effect transistor.

9 Claims, 1 Drawing Figure

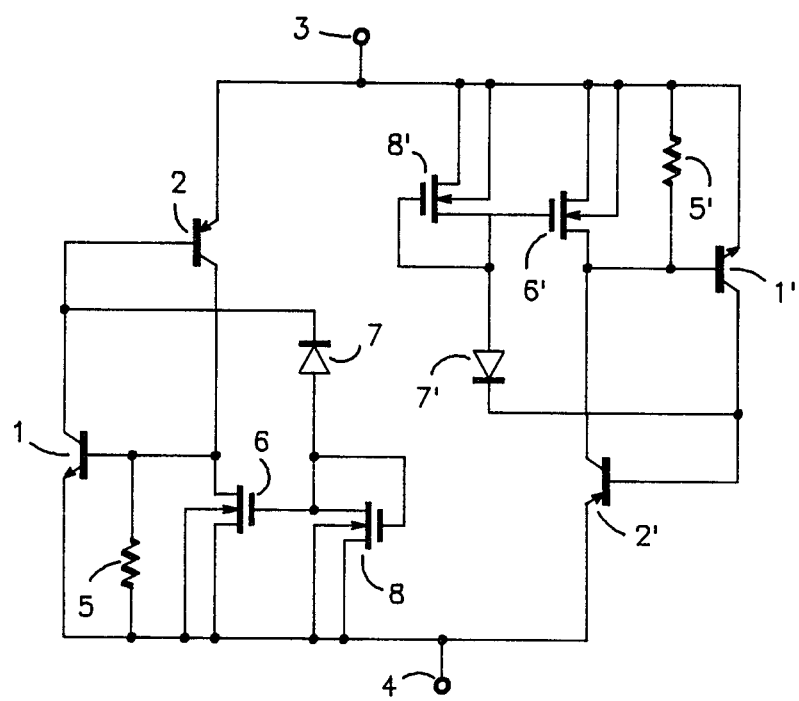

MONOLITHIC ZERO CROSSING TRIAC DRIVER

BACKGROUND OF THE INVENTION

1. Field of the Invention

This invention relates generally to switching circuits and, more particularly, to a thyristor which is optically triggerable near the zero-crossing point.

2. Background Art

Triac drivers are designed for use with a triac in the interface of logic systems to equipment powered from 220 Vac lines, such as solid state relays, industrial controls, motors, solenoids, and consumer appliances. A triac driver is itself a triac, or thyristors connected in inverse parallel, and may be triggered by either a single gate terminal or by the application of light.

Triggering of the triac at high values of main terminal voltages is generally undesirable because of the generation of noise and the possibility of premature device failure because of high localized current density. Therefore, it is desirable to trigger the triac as near as possible at the zero crossing point of the AC main terminal voltage. Many schemes have been designed for achieving zero point switching utilizing thyristors. LEDs are generally used to provide isolation between the logical input and the main terminal voltages and load.

When a thyristor is comprised of a vertical transistor in conjunction with a lateral transistor, the triggering at high main terminal voltages has been inhibited by means of a monolithic MOS field effect transistor coupled between the gate and the cathode of the thyristor. However, the breakdown voltage is limited by the thickness of the gate oxide of the MOS field effect transistor. Since thicker oxide of the gate increases the threshold voltage, a higher breakdown voltage device will decrease the zero-crossing effect.

The gate of the MOS field effect transistor of this previously known circuit was connected to the base of the thyristor. The high voltage appearing at the gate of the field effect transistor and the inability to run the gate metal across a PN junction forced the use of an additional bonding pad for each thyristor.

Therefore, what is needed is a triac driver having an improved zero-crossing effect, a higher breakdown voltage, and fewer bonding pads than previously required.

SUMMARY OF THE INVENTION

Accordingly, it is an object of the present invention to provide a triac driver having an improved zero-crossing effect.

Another object of the present invention is to provide a triac driver having a higher breakdown voltage.

A further object of the present invention is to provide a triac driver requiring fewer bonding pads.

In carrying out the above and other objects of the invention in one form, there is provided an improved triac driver having a first and second terminal adapted to receive an AC voltage. A thyristor is coupled between the first and second terminals. A means is coupled to the thyristor for inhibiting the thyristor when the AC voltage is not substantially near zero. A photovoltaic diode is coupled to the thyristor and the means for inhibiting the thyristor.

The above and other objects, features, and advantages of the present invention will be better understood from the following detailed description taken in conjunction with the accompanying drawing.

BRIEF DESCRIPTION OF THE DRAWING

The single FIGURE is a schematic of the preferred embodiment of the present invention.

DETAILED DESCRIPTION OF THE DRAWING

The single FIGURE is an equivalent schematic representation of the optically-activated zero crossing triac driver. Transistor 1 together with transistor 2 and transistor 1' together with transistor 2' respectively form two thyristors in the so-called back-to-back or inverse parallel configuration. It is to be understood that the thyristors may each be a single PNPN device, but are represented by two transistors for ease of description. Only the connections and operation for the thyristor including transistors 1,2 will be described herein; however, the other thyristor bearing the prime designations will be connected and operated in similar fashion. The collector and base of transistor 1 are connected to the base and collector of transistor 2, respectively. The emitter of transistor 2 is connected to main terminal 3 and the emitter of transistor 1 is connected to main terminal 4. Resistor 5 is coupled between the base of transistor 1 and main terminal 4 for shunting transistor 1 in order to reduce the sensitivity of the thyristor and preclude triggering by unwanted signals. Field effect transistor 6 has its source connected to both the base of transistor 1 and the collector of transistor 2, and its source connected to main terminal 4 for shunting the base to emitter junction of transistor 1. Transistor 6 is preferably an enhancement-type field effect transistor which does not conduct when the voltage across main terminals 3,4 is zero, but which goes into conduction when the voltage between main terminals 3,4 is above the threshold voltage of transistor 6.

Photovoltaic diode 7 has its cathode connected to both the collector of transistor 1 and the base of transistor 2. The anode of diode 7 is connected to the gate of transistor 6 and the drain and gate of field effect transistor 8. The source of transistor 8 is connected to main terminal 4. Transistor 8 is preferably an enhancement-type field effect transistor.

One advantage of using MOS field effect transistors thusly is that they draw only minute amounts of current when the thyristor is in the off state. A conventional LED (not shown) may serve as the source of photons which couple with the bipolar transistors 1,2 thereby causing the thyristors to be switched on. The LED may be placed in the same encapsulation as the thyristor by known techniques.

When the main terminal 3 voltage is high, most of the voltage is applied to diode 7 in a reversed biased condition. By causing diode 7 to have the same junction depth and similar geometrical structure as the collector junction of transistor 1, the threshold voltage of transistor 6 may be controlled in order to maximize the zero-crossing effect.

When the LED is off and the AC voltage on main terminals 3,4 is high, the leakage current of diode 7 will charge the inherent gate capacitance of transistors 6,8. The threshold voltage of transistor 8 is designed to be greater than the threshold voltage of transistor 6. Once the voltage applied to the gates of transistors 6,8 is larger than the threshold voltage of transistor 8, transistor 8 will conduct and discharge the gate charge on transistor 6.

When the LED is on and the AC voltage on main terminals 3,4 is high, photovoltaic diode 7 serves as a current source thereby charging the gate capacitance of transistor 6. Therefore, transistor 6 will conduct and the thyristor latch action is prohibited. As the AC voltage on main terminals 3,4 decreases, the voltage on the cathode of diode 7 will be lower than the voltage on its anode. Then transistor 6 will cease conducting and the triac will latch.

In general, the operation of the back-to-back thyristor is as follows. When the LED provides the triggering means, but the AC voltage on main terminals 3,4 is high, the thyristors will not latch due to the inhibiting action of transistors 6,8,6',8'. When the LED provides the triggering means and the AC voltage on main terminals 3,4 is low, i.e., substantially near the zero-crossing point, transistors 6,8,6',8' will not inhibit the thyristors and the latching action will occur. It may be readily seen that the thyristor including transistors 1,2 will function when the voltage on main terminal 3 is positive and the thyristor including transistors 1',2' will function when the voltage on main terminal 4 is positive.

By now it should be appreciated that there has been provided a triac driver having an improved zero-crossing effect, a higher breakdown voltage, and fewer bonding pads than previously required.

I claim:

1. A monolithic triac driver having a first terminal and a second terminal coupled for receiving an AC voltage, comprising:
   a first thyristor having an anode coupled to said first terminal, a cathode coupled to said second terminal, a base and a gate;
   a first field effect transistor having a gate, and having current-carrying electrodes coupled between said gate of said first thyristor and said cathode of said first thyristor; and
   a first photovoltaic diode having a cathode coupled to said base and an anode coupled to said gate of said first field effect transistor.

2. The triac driver according to claim 1 further comprising a second field effect transistor having current-carrying electrodes coupled between said gate of said first field effect transistor and said second terminal, and a gate coupled to said anode of said first photovoltaic diode.

3. The triac driver according to claim 1 wherein said first field effect transistor is of an enhancement type.

4. The triac driver according to claim 2 wherein said second field effect transistor is of an enhancement type.

5. The triac driver according to claim 2 further comprising resistive means coupled between said gate of said first thyristor and said second terminal.

6. The triac driver according to claim 2 further comprising:
   a second thyristor having an anode coupled to said second terminal, a cathode coupled to said first terminal, a base and a gate;
   a third field effect transistor having a gate, and having current-carrying electrodes coupled between said gate and said cathode of said second thyristor; and
   a second photovoltaic diode having a cathode coupled to said base and an anode coupled to said gate of said third field effect transistor.

7. The triac driver according to claim 6 further comprising a fourth field effect transistor having current-carrying electrodes coupled between said gate of said third field effect transistor and said first terminal, and a gate coupled to said anode of said second photovoltaic diode.

8. The triac driver according to claim 6 wherein said third and said fourth field effect transistors are of an enhancement type.

9. The triac driver according to claim 6 further comprising resistive means coupled between said gate of said second thyristor and said first terminal.

* * * * *